(12) United States Patent
Isogai et al.

(10) Patent No.: US 12,217,783 B2
(45) Date of Patent: Feb. 4, 2025

(54) SEMICONDUCTOR STORAGE WITH TWO POWER SOURCE PATHS

(71) Applicant: SONY SEMICONDUCTOR SOLUTIONS CORPORATION, Kanagawa (JP)

(72) Inventors: Daishi Isogai, Kanagawa (JP); Ryo Haga, Kanagawa (JP)

(73) Assignee: SONY SEMICONUDCTOR SOLUTIONS CORPORATION, Kanagawa (JP)

(*) Notice: Subject to any disclaimer, the term of this patent is extended or adjusted under 35 U.S.C. 154(b) by 150 days.

(21) Appl. No.: 17/999,234

(22) PCT Filed: Apr. 19, 2021

(86) PCT No.: PCT/JP2021/015868
§ 371 (c)(1),
(2) Date: Nov. 18, 2022

(87) PCT Pub. No.: WO2021/241070
PCT Pub. Date: Dec. 2, 2021

(65) Prior Publication Data
US 2023/0223064 A1    Jul. 13, 2023

(30) Foreign Application Priority Data
May 29, 2020   (JP) ................. 2020-094988

(51) Int. Cl.
*G11C 11/16*     (2006.01)
*H10B 61/00*     (2023.01)
*H10N 50/10*     (2023.01)

(52) U.S. Cl.
CPC ...... *G11C 11/1675* (2013.01); *G11C 11/1655* (2013.01); *G11C 11/1697* (2013.01); *H10B 61/22* (2023.02); *H10N 50/10* (2023.02)

(58) Field of Classification Search
CPC ............ G11C 11/1675; G11C 11/1655; G11C 11/1697; H10N 50/10; H01L 27/088; H10B 99/00
See application file for complete search history.

(56) References Cited

U.S. PATENT DOCUMENTS 5,875,145 A * 2/1999 Yamasaki ............... G11C 5/147
                                                         365/230.06
8,804,408 B2 * 8/2014 Shuto .................. G11C 11/1673
                                                         365/158

(Continued)

FOREIGN PATENT DOCUMENTS

JP   2016-157501 A    9/2016
JP   2018-092696 A    6/2018

OTHER PUBLICATIONS

International Search Report and Written Opinion of PCT Application No. PCT/JP2021/015868, issued on Jun. 22, 2021, 08 pages of ISRWO.

*Primary Examiner* — Mushfique Siddique
(74) *Attorney, Agent, or Firm* — CHIP LAW GROUP

(57) ABSTRACT

A semiconductor storage according to an embodiment of the present disclosure includes two power source paths, and a connection path that connects the power source paths. Each of the power source paths includes a power gate transistor and a current source transistor which are coupled in series. The connection path connects ends of the respective power source paths on a side of the current source transistor. The semiconductor storage further includes a storage element, and a switch element inserted between the connection path and the storage element. A back gate is coupled to an internal node in the current source transistor provided in a low-side path of the two power source paths.

14 Claims, 11 Drawing Sheets

(56) References Cited

U.S. PATENT DOCUMENTS

| | | | |
|---|---|---|---|
| 8,902,636 B2 * | 12/2014 | Katayama | G11C 13/0069 |
| | | | 365/158 |
| 2004/0027907 A1 * | 2/2004 | Ooishi | G11C 11/15 |
| | | | 365/226 |
| 2011/0205812 A1 * | 8/2011 | Kajigaya | G11C 11/4097 |
| | | | 365/205 |
| 2011/0261609 A1 * | 10/2011 | Seshadri | G11C 11/417 |
| | | | 365/189.09 |
| 2016/0126953 A1 * | 5/2016 | Ishii | H01L 29/1095 |
| | | | 327/547 |

* cited by examiner

[ FIG. 1 ]
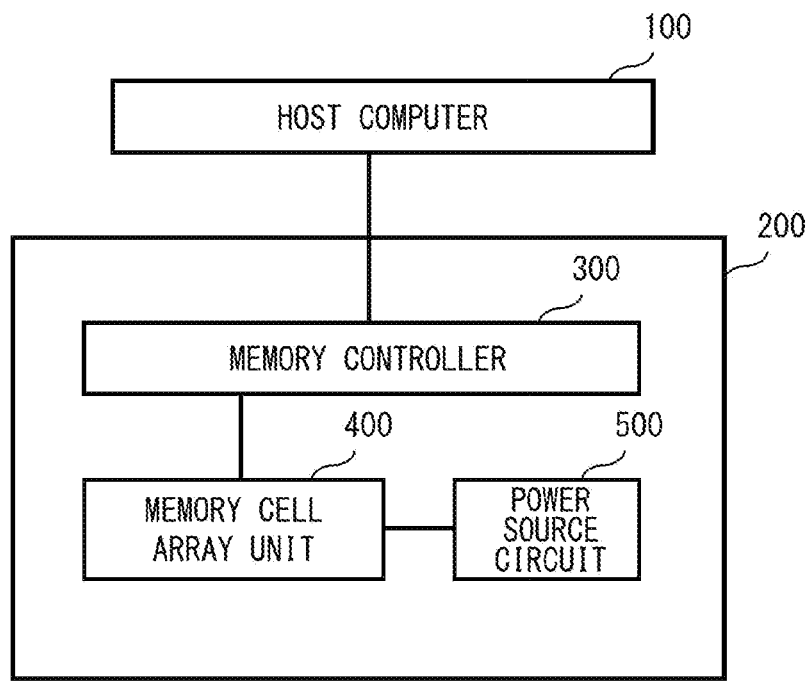

[FIG. 2]
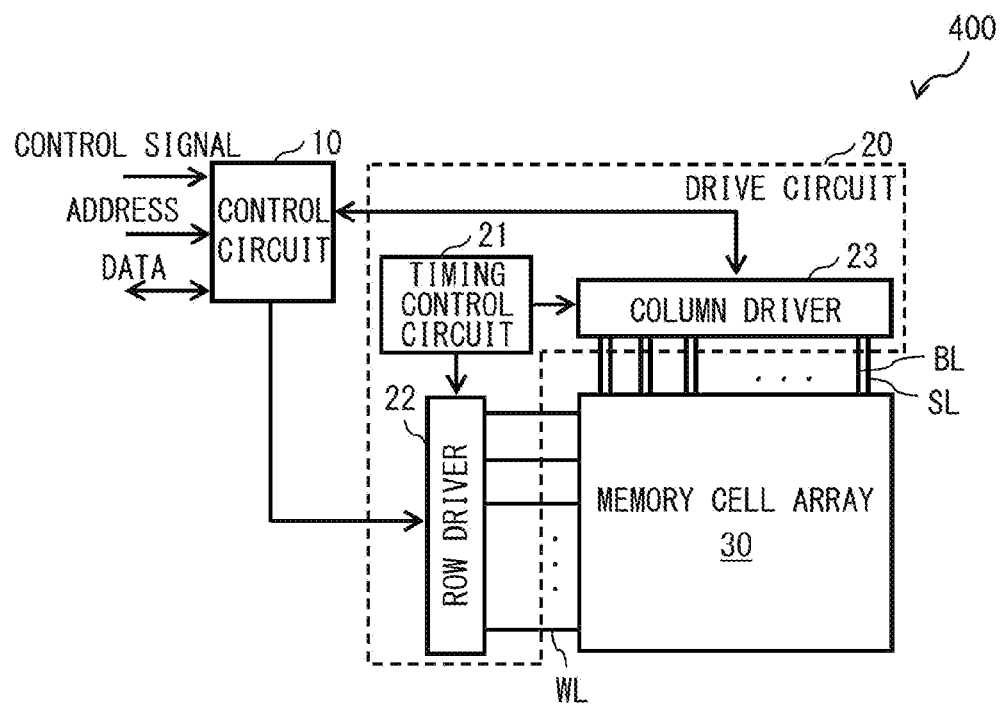

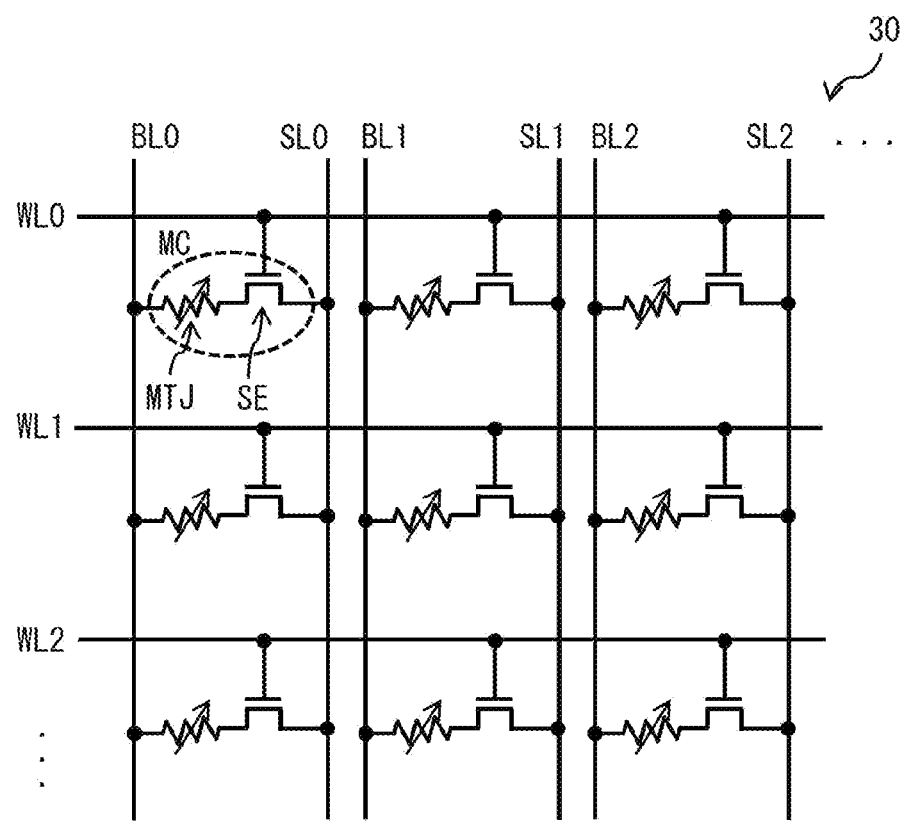
[FIG. 3]

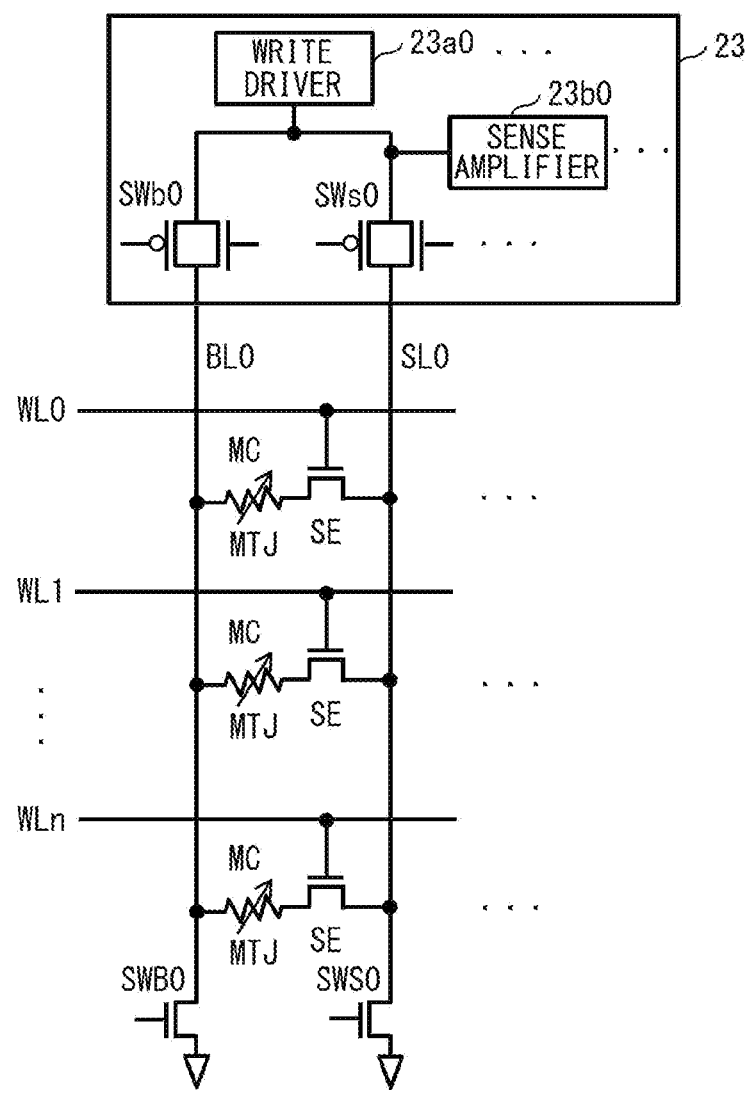
[ FIG. 4 ]

[FIG. 5]
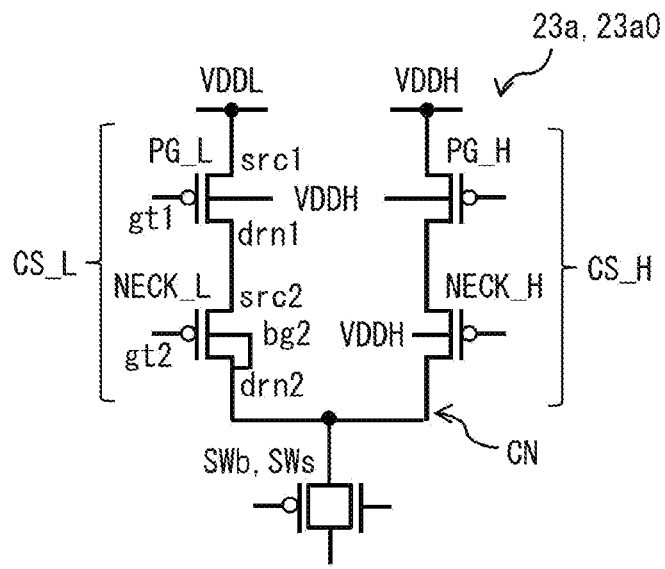
[FIG. 6]
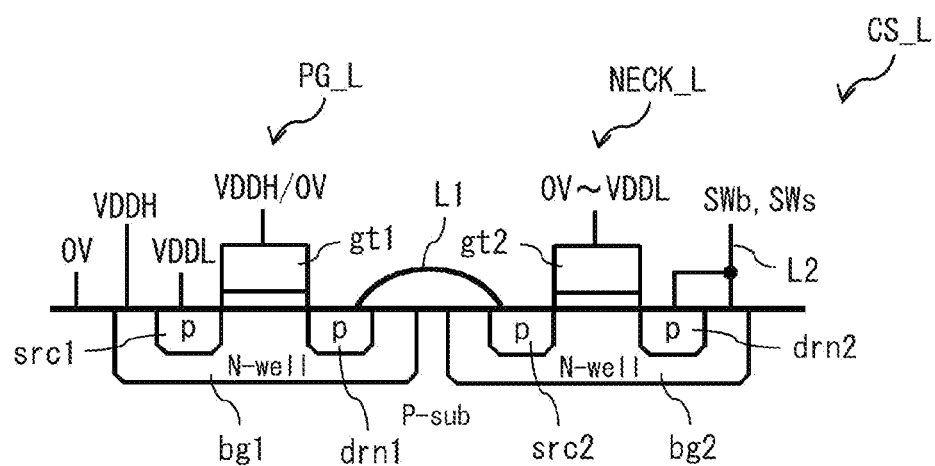

[ FIG. 7 ]
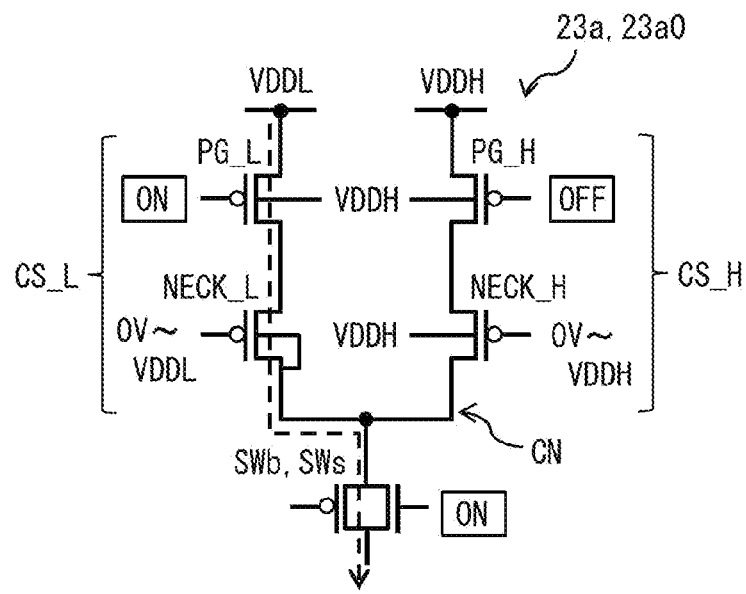
[ FIG. 8 ]
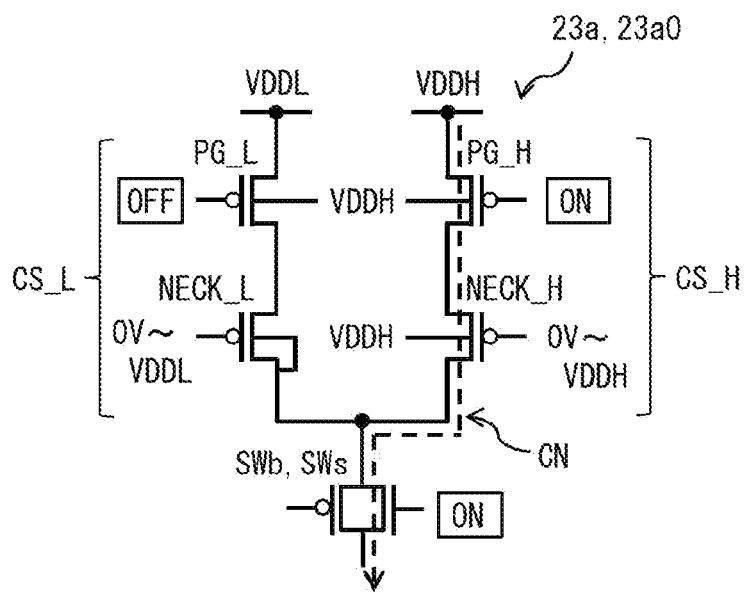

[ FIG. 9 ]
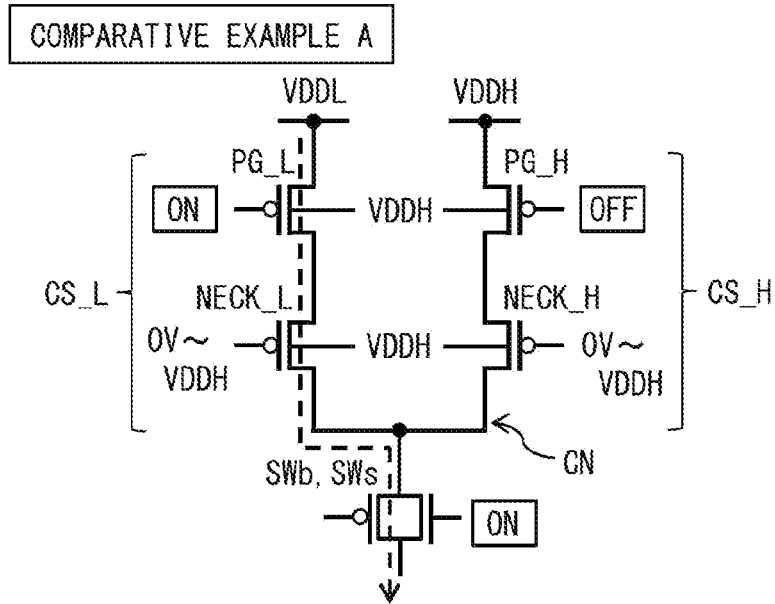
[ FIG. 10 ]
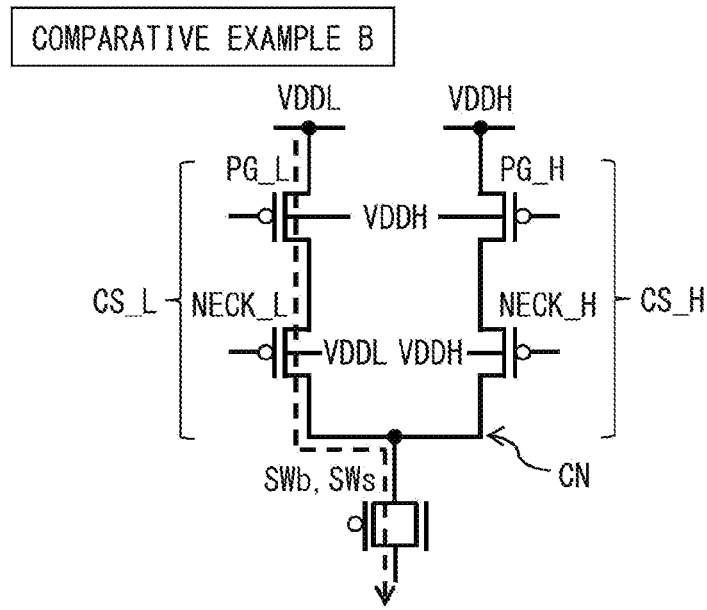

[ FIG. 11 ]
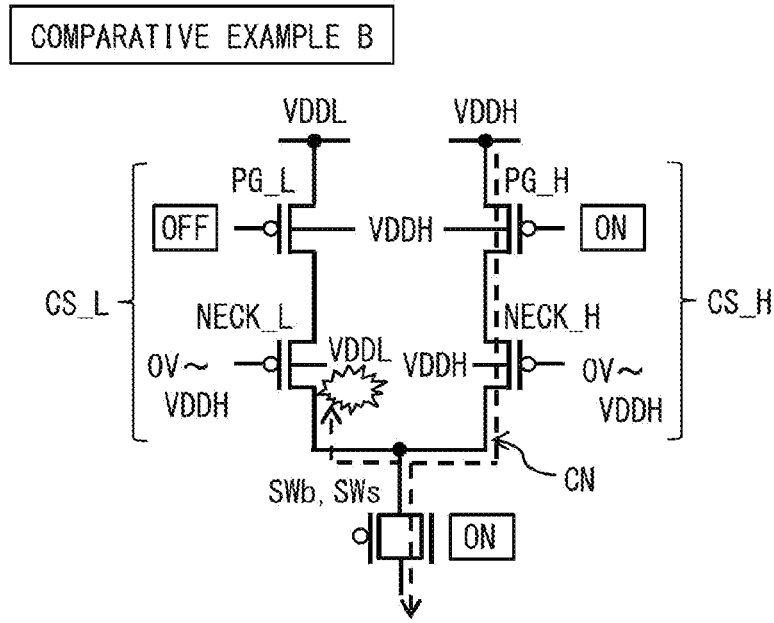
[ FIG. 12 ]
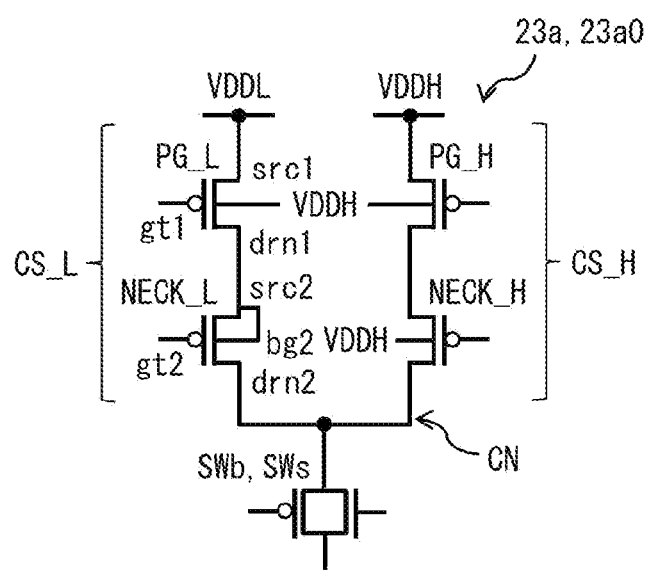

[ FIG. 13 ]
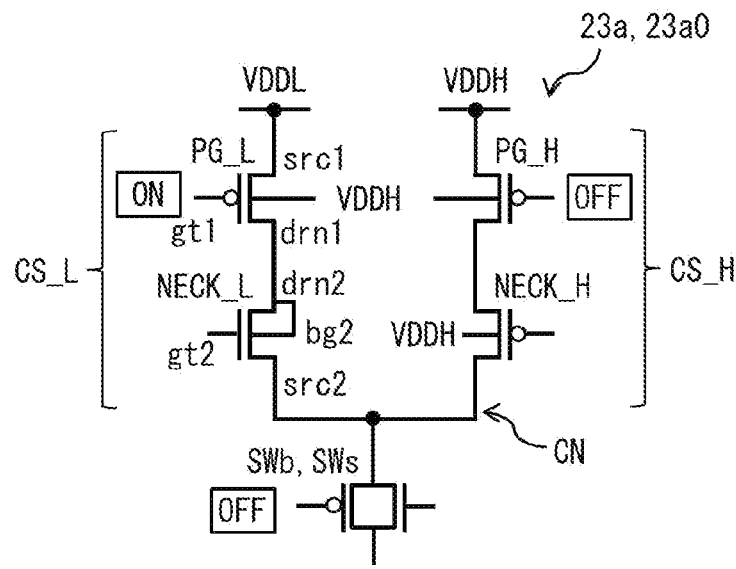
[ FIG. 14 ]
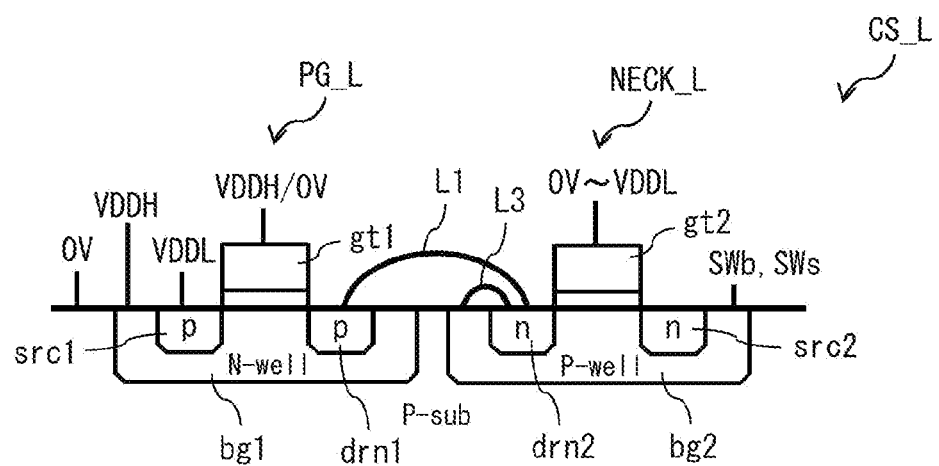

[ FIG. 15 ]
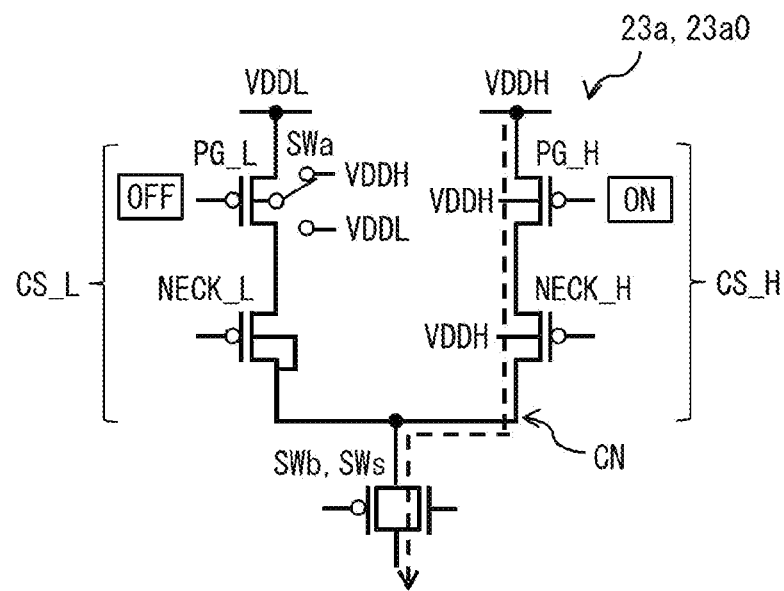
[ FIG. 16 ]
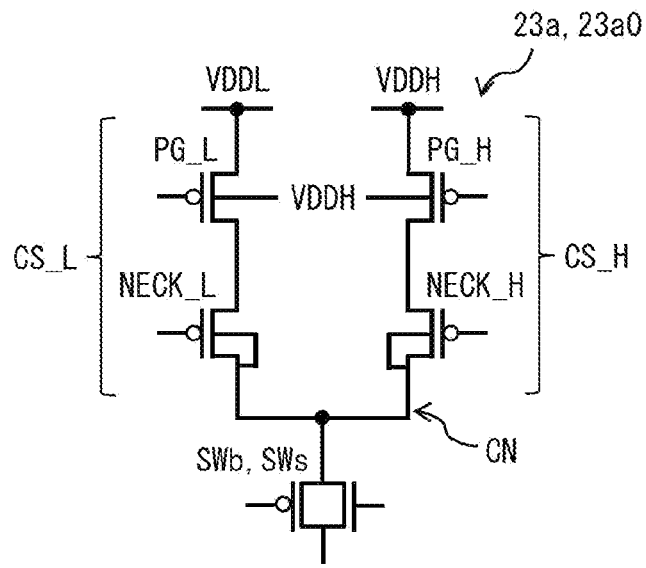

[ FIG. 17 ]
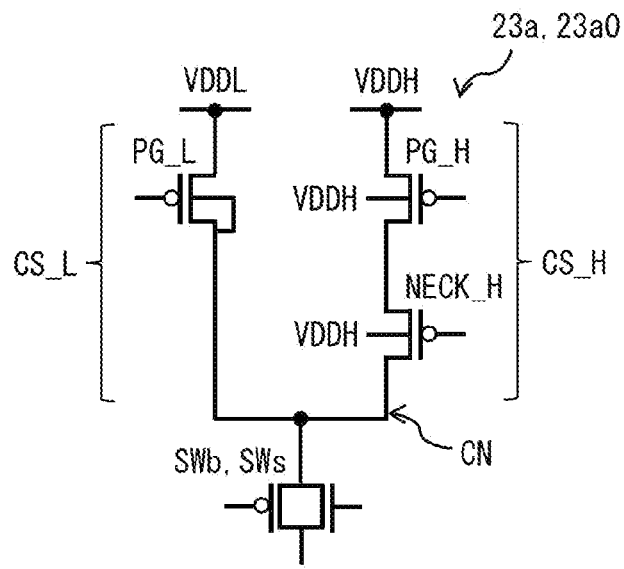
[ FIG. 18 ]
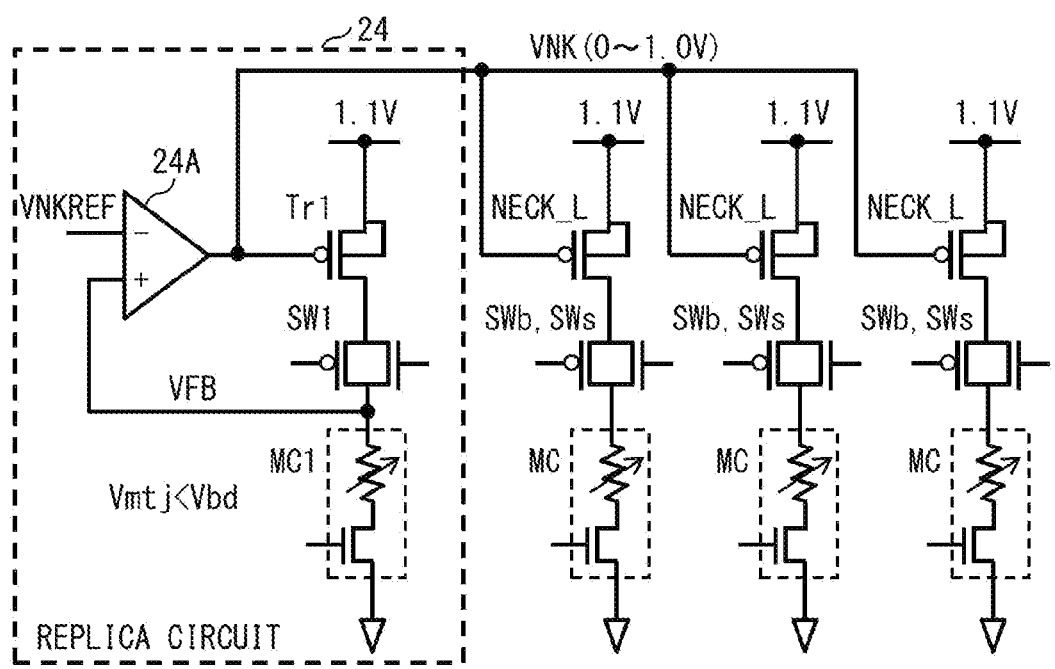

SEMICONDUCTOR STORAGE WITH TWO POWER SOURCE PATHS

CROSS REFERENCE TO RELATED APPLICATIONS

This application is a U.S. National Phase of International Patent Application No. PCT/JP2021/015868 filed on Apr. 19, 2021, which claims priority benefit of Japanese Patent Application No. JP 2020-094988 filed in the Japan Patent Office on May 29, 2020. Each of the above-referenced applications is hereby incorporated herein by reference in its entirety.

TECHNICAL FIELD

The present disclosure relates to a semiconducting storage.

BACKGROUND ART

A magnetoresistance change element has been known as a non-volatile memory. Writing into a magnetoresistance change element MTJ is performed probabilistically depending on an applied voltage. Typically, using a power source path such as a 1.1 V system enables writing into most of the magnetoresistance change elements MTJ. In some cases, however, it may not be possible to perform the writing into some of the magnetoresistance change elements MTJ even using the power source path such as the 1.1 V system. In order to perform writing into all of the magnetoresistance change elements MTJ all at once, it is necessary to use a power source path such as a 1.8 V system. However, using such a high-voltage power source path results in an excessive margin for the writing, and further leads to an increase in power consumption. Therefore, in the existing arts, writing is performed using a power source path of a high-voltage system such as the 1.8 V system only for the magnetoresistance change element MTJ into which writing has been failed after the writing has been performed using a power source path of a low-voltage system such as the 1.1 V system. The use of such two power source paths is disclosed, for example, in PTL 1.

CITATION LIST

Patent Literature

PTL 1: Japanese Unexamined Patent Application Publication No. 2018-92696

SUMMARY OF THE INVENTION

Incidentally, in a case where two power source paths as described above are used, power loss is likely to occur. It is therefore desirable to provide a semiconductor storage in which power loss is less likely to occur.

A semiconductor storage of an embodiment of the present disclosure includes two power source paths, and a connection path that connects the power source paths. Each of the power source paths includes a power gate transistor and a current source transistor which are coupled in series. The connection path connects ends of the respective power source paths on a side of the current source transistor. The semiconductor storage further includes a storage element, and a switch element inserted between the connection path and the storage element. A back gate is coupled to an internal node in the current source transistor provided in a low-side path of the two power source paths.

In the semiconductor storage of an embodiment of the present disclosure, the back gate is coupled to the internal node in the current source transistor (hereinafter, referred to as a "low-side current source transistor") provided in the low-side path (hereinafter, referred to as a "low-side power source path") of the two power source paths. This makes it possible to suppress a phenomenon (Well-Forward) in which an unintentional current flows to the low-side current source transistor as a result of occurrence of a forward bias at the back gate of the low-side current source transistor when a high-side path (hereinafter, referred to as a "high-side power source path") of the two power source paths starts supplying a current.

BRIEF DESCRIPTION OF THE DRAWINGS

FIG. 1 is a diagram illustrating an example of functional blocks of an information processing system according to an embodiment.

FIG. 2 is a diagram illustrating an example of functional blocks of a memory cell array unit in FIG. 1.

FIG. 3 is a diagram illustrating an example of a circuit configuration of a memory cell array in FIG. 2.

FIG. 4 is a diagram illustrating an example of functional blocks of BL/SL drivers in FIG. 2.

FIG. 5 is a diagram illustrating an example of a circuit configuration of a write driver in FIG. 4.

FIG. 6 is a diagram illustrating an example of a cross-sectional configuration of a low-side power source path of the write driver in FIG. 5.

FIG. 7 is a diagram illustrating a state where a current is supplied from the low-side power source path in the write driver in FIG. 4.

FIG. 8 is a diagram illustrating a state where a current is supplied from a high-side power source path in the write driver in FIG. 4.

FIG. 9 is a diagram illustrating a state where a current is supplied from a low-side power source path in a write driver according to a comparative example.

FIG. 10 is a diagram illustrating a state where a current is supplied from a low-side power source path in a write driver according to a comparative example.

FIG. 11 is a diagram illustrating a state where Well-Forward is occurring in the write driver in FIG. 10.

FIG. 12 is a diagram illustrating a modification example of the circuit configuration of the write driver in FIG. 4.

FIG. 13 is a diagram illustrating a modification example of the circuit configuration of the write driver in FIG. 4.

FIG. 14 is a diagram illustrating an example of a cross-sectional configuration of a low-side power source path of the write driver in FIG. 13.

FIG. 15 is a diagram illustrating a modification example of the circuit configuration of the write driver in FIG. 4.

FIG. 16 is a diagram illustrating a modification example of the circuit configuration of the write driver in FIG. 4.

FIG. 17 is a diagram illustrating a modification example of the circuit configuration of the write driver in FIG. 4.

FIG. 18 is a diagram illustrating an example of a circuit configuration of a replica circuit additionally provided in the BL/SL drivers in FIG. 1.

MODES FOR CARRYING OUT THE INVENTION

Hereinafter, description is given in detail of modes for carrying out the present disclosure with reference to the drawings. It is to be noted that, in the present specification and drawings, repeated description is omitted for components substantially having the same functional configuration by assigning the same reference numerals.

Embodiment

[Configuration]
FIG. 1 illustrates an example of functional blocks of an information processing system according to an embodiment. The information processing system includes a host computer 100 and a memory device 200. The memory device 200 includes a memory controller 300, one or a plurality of memory cell array units 400, and a power source circuit 500. It is to be noted that FIG. 1 exemplifies a state where one memory cell array unit 400 is provided. The memory cell array unit 400 corresponds to a specific example of a "semiconductor storage" of the present disclosure.

(Host Computer 100)
The host computer 100 controls the memory device 200. Specifically, the host computer 100 issues a command designating a logical address to be accessed, and supplies the command or data to the memory device 200. The host computer 100 receives data outputted from the memory device 200. Here, the command is directed to controlling the memory device 200, and includes, for example, a write command ordering processing to write data, a read command ordering processing to read data, or a reset command ordering processing to erase data. In addition, the logical address is an address allocated for each access unit region when the host computer 100 accesses the memory device 200 in an address space defined by the host computer 100.

(Memory Controller 300)
The memory controller 300 controls the one or the plurality of memory cell array units 400. The memory controller 300 receives a write command designating a logical address from the host computer 100. In addition, the memory controller 300 executes the processing to write data in accordance with the write command. In this write processing, the logical address is converted into a physical address, and data is written into the physical address. Here, the physical address is an address allocated in the one or the plurality of memory cell array units 400 for each access unit at the time when the memory controller 300 accesses the one or the plurality of memory cell array units 400. When receiving a read command designating a logical address, the memory controller 300 converts the logical address into a physical address, and reads data from the physical address. Then, the memory controller 300 outputs, as read data, the read data to the host computer 100. In addition, when receiving a reset command designating a logical address from the host computer 100, the memory controller 300 converts the logical address into a physical address, and erases data written into the physical address.

(Power Source Circuit 500)
The power source circuit 500 supplies a desired voltage to the one or the plurality of memory cell array units 400. The power source circuit 500 supplies a row driver 22 described later, for example, with a voltage or the like to be used upon writing, reading, or resetting. The power source circuit 500 supplies a column driver 23 described later, for example, with a voltage or the like to be used upon writing, reading, or resetting.

(Memory Cell Array Unit 400)
Next, description is given of the memory cell array unit 400. FIG. 2 illustrates an example of functional blocks of the memory cell array unit 400. The memory cell array unit 400 is configured by, for example, semiconductor chips. The memory cell array unit 400 includes, for example, a control circuit 10, a drive circuit 20, and a memory cell array 30. The control circuit 10 and the drive circuit 20 each correspond to a specific example of a "control circuit" of the present disclosure. For example, the control circuit 10 exchanges a command, write data, and read data with the memory controller 300. For example, the control circuit 10 writes data into the memory cell array 30 in accordance with the write command, and reads data from the memory cell array 30 in accordance with the read command. In addition, for example, the control circuit 10 erases data at a predetermined location in the memory cell array 30 in accordance with the reset command.

(Memory Cell Array 30)
FIG. 3 illustrates an example of a circuit configuration of the memory cell array 30. The memory cell array 30 is, for example, a so-called STT-MRAM (Spin Transfer Torque Magnetic Random Access Memory). The memory cell array 30 includes a plurality of memory cells MC. The memory cell MC includes a magnetoresistance change element MTJ and a switch element SE that controls a current to be flowed to the magnetoresistance change element MTJ.

The magnetoresistance change element MTJ is, for example, a storage element including a magnetic tunnel junction. The magnetoresistance change element MTJ includes, for example, a fixed layer (RL) and a free layer (FL), and includes an ultra-thin tunnel insulating film layer between the fixed layer (RL) and the free layer (FL). In the magnetoresistance change element MTJ, stored data (electric resistance value) is rewritten by changing a direction of magnetization of the free layer (FL). In the magnetoresistance change element MTJ, electrons of which spin orientations are aligned are injected into the magnetoresistance change element MTJ when the direction of the magnetization of the free layer (FL) is changed. The orientation of the spin of the injected electron is opposite to that of electronic spin of the free layer (FL), and thus a torque of the spin of the injected electron serves as a torque to move the electronic spin of the free layer (FL), thus finally inverting the orientation of the electronic spin of the free layer (FL) (magnetization inversion).

The memory cell array 30 includes, for example, a plurality of word lines WL, a plurality of bit lines BL, a plurality of memory cells MC arranged one by one for respective positions at which the word lines WL and the bit lines BL are opposed to one another, and a plurality of source lines SL. FIG. 3 illustrates an example in which the memory cells MC are arranged at respective intersections of three bit lines BL0, BL1, and BL2 and three word lines WL0, WL1, and WL2. In addition, FIG. 3 illustrates an example in which three source lines SL0, SL1, and SL2 are arranged one by one for respective memory cell columns. It is to be noted that the arrangement and the number of the bit lines BL, the word lines WL, the memory cells MC, and the source lines SL are not limited to the illustrated example.

In the memory cell array 30, it is possible to write data into the memory cell MC designated by an address input from the outside. In addition, it is possible to read data stored in the memory cell MC designated by an address input. Data values stored in the memory cell MC are distinguished by resistance states of the magnetoresistance change element MTJ. For example, a high-resistance state is distinguished into "0", whereas a low-resistance state is distinguished into "1".

(Drive Circuit 20)

Next, description is given of the drive circuit 20. The drive circuit 20 includes, for example, a timing control circuit 21, the row driver 22, and the column driver 23, as illustrated in FIG. 2.

The timing control circuit 21 outputs, to the row driver 22 and the column driver 23, a signal to control a timing of changing an output voltage. The timing control circuit 21 sets an output voltage of the row driver 22 to a voltage to be used upon writing, reading, and resetting, for example, by setting a first control signal to high. The timing control circuit 21 sets the output voltage of the row driver 22 to a voltage to be used upon non-writing, non-reading, and non-resetting, for example, by setting the first control signal to low. The timing control circuit 21 sets an output voltage of the column driver 23 to a voltage to be used upon writing, for example, by setting each of a second control signal and a third control signal to high. The timing control circuit 21 sets the output voltage of the column driver 23 to a voltage to be used upon non-writing, non-reading, and non-resetting, for example, by setting the second control signal to high and setting the third control signal to low. The timing control circuit 21 sets the output voltage of the column driver 23 to a voltage to be used upon resetting, for example, by setting each of the second control signal and the third control signal to low.

The row driver 22 includes a circuit that drives each of the word lines WL at a predetermined voltage necessary for an operation of writing, reading, or resetting when performing the operation of writing, reading, or resetting. The row driver 22 is coupled to each of the word lines WL of the memory cell array 30, and selects a corresponding word line WL by means of a row address inputted from the address line. The row driver 22 outputs, to the selected word line WL, the predetermined voltage necessary for the operation of writing, reading, or resetting.

The column driver 23 includes a circuit (e.g., a write driver 23*a* described later) that drives the bit line BL coupled to the memory cell MC, into which data "1" is written, at a predetermined voltage necessary for the reset operation, when performing the operation of writing the data "1", i.e., when performing the write (reset) operation of changing the magnetoresistance change element MTJ of the memory cell MC from a high-resistance state to a low-resistance state. That is, the column driver 23 erases data in the memory cell MC by changing the magnetoresistance change element MTJ from a high-resistance state to a low-resistance state. The column driver 23 further includes a circuit (e.g., the write driver 23*a* described later) that drives the bit line BL coupled to the memory cell MC, into which data "0" is written, at a predetermined voltage necessary for the set operation, when performing the operation of writing the data "0", i.e., when performing the write (set) operation of changing the magnetoresistance change element MTJ of the memory cell MC from a low-resistance state to a high-resistance state. That is, a voltage control circuit 24 writes data stored in the memory cell MC by changing the magnetoresistance change element MTJ from a low-resistance state to a high-resistance state. The voltage control circuit 24 further includes a circuit that drives the bit line BL coupled to the memory cell MC, which reads data, at a predetermined voltage at which data is not rewritten when performing the operation of reading data. That is, the voltage control circuit 24 reads the data stored in the memory cells MC without changing the resistance state of the magnetoresistance change element MTJ.

The column driver 23 includes a circuit (e.g., the write driver 23*a* described later) that drives the source line SL coupled to the memory cell MC, which performs the reset operation, to have a predetermined voltage necessary for the reset operation when performing the reset operation. The column driver 23 further includes a circuit (e.g., the write driver 23*a* described later) that drives the source line SL coupled to the memory cell MC, which performs the set operation, to have a predetermined voltage necessary for the set operation when performing the set operation. The column driver 23 further includes a circuit that drives the source line SL coupled to the memory cell MC, which performs the read operation, to have a predetermined voltage necessary for the read operation when performing the read operation.

The column driver 23 is coupled to each of the bit lines BL of the memory cell array 30, and selects a corresponding bit line BL by means of a column address inputted from the address line. The column driver 23 outputs a predetermined voltage necessary for the operation of writing, reading, or resetting to the selected bit line BL.

FIG. 4 illustrates an example of functional blocks of the column driver 23. The column driver 23 includes, for example, a plurality of write drivers 23*a* and a plurality of sense amplifiers 23*b*. The write drivers 23*a* are provided one by one for respective sets of the bit lines BL and the source lines SL coupled to both ends of the memory cell MC, for example. The sense amplifiers 23*b* are provided one by one for the respective sets of the bit lines BL and the source lines SL coupled to the both ends of the memory cell MC, for example. An output end of the write driver 23*a* is coupled to one end of a set of the bit line BL and the source line SL. An input end of the sense amplifier 23*b* is coupled to one end of the source line SL.

FIG. 4 illustrates an example in which a write driver 23*a*0 and a sense amplifier 23*b*0 are provided for a set of the bit line BL0 and the source line SL0. An output end of the write driver 23*a*0 is coupled to one end of a set of the bit line BL0 and the source line SL0. An input end of the sense amplifier 23*b*0 is coupled to one end of the source line SL0.

The column driver 23 further includes, for example, a plurality of column switch elements SWb provided one by one for respective bit lines BL, and a plurality of column switch elements SWs provided one by one for respective source lines SL. The column switch element SWb is inserted into an end of the bit line BL on a side of the write driver 23*a*. The column switch element SWs is inserted into an end of the source line SL on the side of the write driver 23*a*. A switch element SWB is inserted into an end of the bit line BL on a side opposite to the write driver 23*a*. A switch element SWS is inserted into an end of the source line SL on the side opposite to the write driver 23*a*.

FIG. 4 illustrates an example in which a column switch element SWb0 is inserted into an end of the bit line BL on a side of the write driver 23*a*0 and a column switch element SWs0 is inserted into an end of the source line SL on the side of the write driver 23*a*0. In addition, FIG. 4 illustrates an example in which a switch element SWB0 is inserted into an end of the bit line BL0 on a side opposite to the write driver 23*a*0 and a switch element SWS0 is inserted into an end of the source line SL0 on the side opposite to the write driver 23*a*0.

The write driver 23*a* is coupled to the magnetoresistance change elements MTJ of the plurality of memory cells MC via the column switch element SWb. The write driver 23*a* is further coupled to the switch elements SE of the plurality of memory cells MC via the column switch element SWs. FIG. 4 illustrates an example in which the write driver 23*a*0 is coupled to the magnetoresistance change elements MTJ of the plurality of memory cells MC via the column switch element SWb0. In addition, FIG. 4 illustrates an example in which the write driver 23a0 is coupled to the switch elements SE of the plurality of memory cells MC via the column switch element SWs0.

FIG. 5 illustrates an example of a functional block of the write driver 23a. The write driver 23a includes, for example, two power source paths CS_H and CS_L. In the two power source paths CS_H and CS_L, the power source path CS_H is a high-side power source path coupled to a wiring line to which a power source voltage VDDH having a relatively high voltage (e.g., 1.8 V) is applied. In the two power source paths CS_H and CS_L, the power source path CS_L is a low-side power source path coupled to a wiring line to which a power source voltage VDDL having a relatively low voltage (e.g., 1.1 V) is applied.

The write driver 23a further includes, for example, a connection path CN that connects ends of the two power source paths CS_H and CS_L on a side opposite to a side of the wiring lines to which the power source voltages VDDH and VDDL are applied. The switch element SWb or the switch element SWs is inserted between the connection path CN and the memory cell MC (magnetoresistance change element MTJ).

The power source path CS_H includes a power gate transistor PG_H and a current source transistor NECK_H which are coupled in series. The power gate transistor PG_H is disposed close to the wiring line to which the power source voltage VDDH is applied, and the current source transistor NECK_H is disposed distant from the wiring line to which the power source voltage VDDH is applied. In the power gate transistor PG_H, a source is coupled to the wiring line to which the power source voltage VDDH is applied, and a drain is coupled to a source of the current source transistor NECK_H. The power source voltage VDDH is applied to a back gate of the power gate transistor PG_H. In the current source transistor NECK_H, the source is coupled to the drain of the power gate transistor PG_H, and a drain is coupled to the connection path CN. The power source voltage VDDL is applied to a back gate of the current source transistor NECK_H.

The power source path CS_L includes a power gate transistor PG_L and a current source transistor NECK_L which are coupled in series. The power gate transistor PG_L is disposed close to the wiring line to which the power source voltage VDDL is applied, and the current source transistor NECK_L is disposed distant from the wiring line to which the power source voltage VDDL is applied. In the power gate transistor PG_L, a source src1 is coupled to the wiring line to which the power source voltage VDDL is applied, and a drain drn1 is coupled to a source src2 of the current source transistor NECK_L. The power source voltage VDDH is applied to a back gate bg1 of the power gate transistor PG_H. In the current source transistor NECK_L, the source src2 is coupled to the drain drn1 of the power gate transistor PG_L, and a drain drn2 is coupled to the connection path CN. A back gate bg2 of the current source transistor NECK_L is coupled to the drain drn2 (internal node).

FIG. 6 illustrates an example of a cross-sectional configuration of the power source path CS_L. The power gate transistor PG_L is, for example, a p-channel type MOSFET (thin-film transistor). At this time, in the power gate transistor PG_L, the source src1 and the drain drn1 are each configured by a p-type semiconductor, and the source src1 and the drain drn1 are formed inside an N-well (n-type semiconductor) with a predetermined gap interposed therebetween. The N-well functions as the back gate bg1. A gate insulating film is in contact with a region, of the N-well, between the source src1 and the drain drn1, and a gate gt1 is disposed to be opposed to the N-well with the gate insulating film interposed therebetween. A p-channel is formed in a region, of the N-well, opposed to the gate gt1 with the gate insulating film interposed therebetween.

The current source transistor NECK_L is, for example, a p-channel type MOSFET (thin-film transistor). At this time, in the current source transistor NECK_L, the source src2 and the drain drn2 are each configured by a p-type semiconductor, and the source src2 and the drain drn2 are formed inside an N-well (n-type semiconductor) with a predetermined gap interposed therebetween. The N-well functions as the back gate bg2. A gate insulating film is in contact with a region, of the N-well, between the source src2 and the drain drn2, and a gate gt2 is disposed to be opposed to the N-well with the gate insulating film interposed therebetween. A p-channel is formed in a region, of the N-well, opposed to the gate gt2 with the gate insulating film interposed therebetween.

The power gate transistor PG_L and the current source transistor NECK_L are each formed in a p-type semiconductor layer, for example. The p-type semiconductor layer electrically separates the N-well of the power gate transistor PG_L and the N-well of the current source transistor NECK_L from each other. The drain drn1 of the power gate transistor PG_L and the source src2 of the current source transistor NECK_L are electrically coupled to each other via a wiring line L1. The drain drn2 and the back gate bg2 of the current source transistor NECK_L are electrically coupled to each other via a wiring line L2, and are coupled to the column switch elements SWb and SWs via the wiring line L2. For example, 0 V is applied to the p-type semiconductor layer described above.

[Write Operation]

Next, description is given of an example of the write operation. On the basis of a control signal inputted from the control circuit 10 and a control signal inputted from the timing control circuit, the write driver 23a controls the power gate transistors PG_H and PG_L, the current source transistors NECK_H and NECK_L, and the column switch elements SWb and SWs, thereby allowing for selection of one of the two power source paths CS_H and CS_L. In addition, flowing a current supplied from the selected power source path to the magnetoresistance change element MTJ via the column switch elements SWb and SWs allows for writing into the magnetoresistance change element MTJ.

As illustrated in FIG. 7, for example, the write driver 23a turns off the power gate transistor PG_H, turns on the power gate transistor PG_L, and further turns on the column switch element SWb or the column switch element SWs. At this time, the write driver 23a applies a voltage within a range of 0 V to VDDH to the gate of the current source transistor NECK_H, for example, depending on the magnitude of a current flowed to the memory cell MC (magnetoresistance change element MTJ), and applies a voltage within a range of 0 V to VDDL to the gates of the current source transistors NECK_H and NECK_L. This allows the write driver 23a to supply a current of a predetermined magnitude to the memory cell MC (magnetoresistance change element MTJ) from the low-side power source path CS_L via the column switch element SWb or the column switch element SWs.

As illustrated in FIG. 8, for example, the write driver 23a turns on the power gate transistor PG_H, turns off the power gate transistor PG_L, and further turns on the column switch element SWb or the column switch element SWs. At this time, the write driver 23a applies a voltage within a range of 0 V to VDDH to the gate of the current source transistor NECK_H, for example, depending on the magnitude of a current flowed to the memory cell MC (magnetoresistance change element MTJ), and applies a voltage within a range of 0 V to VDDL to the gates of the current source transistors NECK_H and NECK_L. This allows the write driver 23a to supply a current of a predetermined magnitude to the memory cell MC (magnetoresistance change element MTJ) from the high-side power source path CS_H via the column switch element SWb or the column switch element SWs.

[Effects]

Next, description is given of effects of the information processing system according to an embodiment of the present disclosure, while comparing with comparative examples.

The writing into the magnetoresistance change element MTJ is performed probabilistically depending on an applied voltage. Typically, using a power source path such as a 1.1 V system enables writing into most of the magnetoresistance change elements MTJ. In some cases, however, it may not be possible to perform the writing into some of the magnetoresistance change elements MTJ even using the power source path such as the 1.1 V system. In order to perform writing into all of the magnetoresistance change elements MTJ all at once, it is necessary to use a power source path such as a 1.8 V system. However, using such a high-voltage power source path results in an excessive margin for the writing, and further leads to an increase in power consumption. Therefore, in the existing arts, writing is performed using a power source path of a high-voltage system such as the 1.8 V system only for the magnetoresistance change element MTJ into which writing has been failed after the writing has been performed using a power source path of a low-voltage system such as the 1.1 V system.

As illustrated in FIG. 9, for example, when the low-voltage side power source path CS_L of the two power source paths CS_H and CS_L is used for the writing, it is necessary to perform the writing to allow the loss of a current driving capacity to be as small as possible. In order to obtain a current driving capacity necessary for the writing, it is necessary to use a large-size transistor as the current source transistor NECK_L.

The use of the large-size transistor results in a larger size of the write driver. Therefore, in order to obtain the current driving capacity necessary for the writing while keeping the size of the transistor small, for example, it is conceivable to use a thin-film transistor as the current source transistor NECK_L and to set the voltage of the back gate of the thin-film transistor to VDDL, as illustrated in FIG. 10. However, in such a case, for example, as illustrated in FIG. 11, when the high-voltage side power source path CS_H is used for the writing, a forward bias occurs at the back gate of the current source transistor NECK_L, causing a phenomenon (Well-Forward) in which an unintentional current flows to the current source transistor NECK_L. This result in occurrence of power loss.

Meanwhile, in the present embodiment, the back gate bg2 is coupled to the drain drn2 (internal node) in the current source transistor NECK_L provided in the low-side power source path CS_L of the two power source paths CS_H and CS_L. This makes it possible to suppress occurrence of the Well-Forward in the current source transistor NECK_L provided in the low-side power source path CS_L when the high-side power source path CS_H of the two power source paths CS_H and CS_L starts supplying a current. As a result, it is possible to suppress power loss. Accordingly, it is possible to provide the memory cell array unit 400 in which power loss is less likely to occur. In addition, the back gate bg2 is coupled to the drain drn2 (internal node), and thus a substrate bias of the current source transistor NECK_L has the same electric potential as that of the drain drn2 (internal node). This makes it possible to suppress a substrate bias effect when the low-side power source path CS_L starts supplying a current, thus making it possible to reduce the loss of a driving capacity of the current source transistor NECK_L.

In addition, in the present embodiment, controlling the power gate transistors PG_H and PG_L, the current source transistors NECK_H and NECK_L, and the column switch elements SWb and SWs allows for selection of one of the two power source paths CS_H and CS_L. In addition, flowing a current supplied from the selected power source path to the magnetoresistance change element MTJ via the column switch elements SWb and SWs allows for writing into the magnetoresistance change element MTJ. At this time, it is possible to suppress occurrence of the Well-Forward in the current source transistor NECK_L provided in the low-side power source path CS_L when the high-side power source path CS_H of the two power source paths CS_H and CS_L starts supplying a current. As a result, it is possible to suppress power loss. Accordingly, it is possible to provide the memory cell array unit 400 in which power loss is less likely to occur.

In addition, in the present embodiment, the source and the drain of the current source transistor NECK_L provided in the low-side power source path CS_L are each configured by a p-type semiconductor. Further, the back gate bg2 is coupled to the drain drn2 in the current source transistor NECK_L provided in the low-side power source path CS_L of the two power source paths CS_H and CS_L. This makes it possible to suppress occurrence of the Well-Forward in the current source transistor NECK_L provided in the low-side power source path CS_L when the high-side power source path CS_H of the two power source paths CS_H and CS_L starts supplying a current. As a result, it is possible to suppress power loss. Accordingly, it is possible to provide the memory cell array unit 400 in which power loss is less likely to occur.

In addition, in the present embodiment, the current source transistor NECK_L provided in the low-side power source path CS_L of the two power source paths CS_H and CS_L is a thin-film transistor. This enables the size of the current source transistor NECK_L to be smaller. Furthermore, the back gate bg2 is coupled to the drain drn2 (internal node) in the current source transistor NECK_L, thus making it possible to suppress occurrence of the Well-Forward in the current source transistor NECK_L, which leads to an improvement in a driving capacity of the current source transistor NECK_L. Accordingly, it is possible to provide the memory cell array unit 400 including a driver having a sufficient driving capacity with a small area.

Modification Examples

Next, description is given of modification examples of the information processing system according to the foregoing embodiment.

Modification Example A

In the foregoing embodiment, for example, the back gate bg2 of the current source transistor NECK_L may be coupled to the source src2 (internal node), as illustrated in FIG. 12. Also in such a case, it is possible to suppress occurrence of the Well-Forward in the current source transistor NECK_L. As a result, it is possible to suppress power loss. Accordingly, it is possible to provide the memory cell array unit 400 in which power loss is less likely to occur.

Modification Example B

In the foregoing modification example A, for example, the current source transistor NECK_L may be an n-channel type MOSFET (thin-film transistor), as illustrated in FIG. 13. At this time, for example, as illustrated in FIG. 14, the source src2 and the drain drn2 are each configured by an n-type semiconductor in the current source transistor NECK_L, and the source src2 and the drain drn2 are formed inside a P-well (p-type semiconductor) with a predetermined gap interposed therebetween. The P-well functions as the back gate bg2. A gate insulating film is in contact with a region, of the P-well, between the source src2 and the drain drn2, and the gate gt2 is opposed to the P-well with the gate insulating film interposed therebetween. An n-channel is formed in a region, of the P-well, opposed to the gate gt2 with the gate insulating film interposed therebetween.

The power gate transistor PG_L and the current source transistor NECK_L are each formed in the p-type semiconductor layer, for example. The p-type semiconductor layer electrically separates the N-well of the power gate transistor PG_L and the P-well of the current source transistor NECK_L from each other. The drain drn1 of the power gate transistor PG_L and the drain drn2 of the current source transistor NECK_L are electrically coupled to each other via the wiring line L1. The drain drn2 and the back gate bg2 of the current source transistor NECK_L are electrically coupled to each other via a wiring line L3.

In the present modification example, the source and the drain of the current source transistor NECK_L provided in the low-side power source path CS_L are each configured by the n-type semiconductor. Further, the back gate bg2 is coupled to the drain drn2 (internal node) in the current source transistor NECK_L provided in the low-side power source path CS_L of the two power source paths CS_H and CS_L. This makes it possible to suppress occurrence of the Well-Forward in the current source transistor NECK_L. Accordingly, it is possible to provide the memory cell array unit 400 in which power loss is less likely to occur with a small size.

In the present modification example, for example, the write driver 23a may turn on the power gate transistor PG_L provided in the low-side power source path CS_L when turning off the column switch elements SWb and SWs, as illustrated in FIG. 13. In such a case, it is possible to use the thin-film transistor within a withstand voltage range. In a case where all of the column switch elements SWb and SWs and the power gate transistors PG_L and PG_H are turned off, an electric potential of the connection path CN may possibly drop to around 0 V due to off-leakage of the column switch elements SWb and SWs. In this case, a voltage exceeding an electric withstand voltage of the thin-film transistor may possibly be applied between the gt2 and the src2 of the current source transistor NECK_L. Therefore, as illustrated in FIG. 13, by turning on the power gate transistor PG_L provided in the low-side power source path CS_L when turning off the column switch elements SWb and SWs, it is possible to use the current source transistor NECK_L as the thin-film transistor.

Modification Example C

In the foregoing embodiment and modification examples thereof, the power gate transistor PG_L provided in the low-side power source path CS_L may include, for example, a switch element SWa at the back gate bg1, as illustrated in FIG. 15. The switch SWa is an element that selectively supplies the back gate bg1 with the voltages (power source voltages VDDH and VDDL) supplied to ends of the two power source paths CS_H and CS_L on the side of the power gate transistors PG_H and PG_L. For example, as illustrated in FIG. 15, when the high-side power source path CS_H is selected from among the two power source paths CS_H and CS_L, the write driver 23a controls the switch element SWa to supply the power source voltage VDDH to the back gate bg1. This makes it possible to suppress occurrence of the Well-Forward in the power gate transistor PG_L. In addition, when the low-side power source path CS_L is selected, the switch element SWa is controlled to supply the power source voltage VDDL to the back gate bg1, thereby enabling suppression of a substrate bias effect of the power gate transistor PG_L, thus making it possible to suppress the loss of the transistor driving capacity.

Modification Example D

In the foregoing embodiment and modification examples thereof, for example, as illustrated in FIG. 16, the back gate may be coupled to an internal node (source or drain) in the current source transistor NECK_H provided in the high-side power source path CS_H of the two power source paths CS_H and CS_L. In such a case, the driving capacity of the current source transistor NECK_H is improved, which leads to obtainment of the same driving capacity with a smaller area, thus making it possible to improve an area efficiency.

Modification Example E

In the foregoing embodiment, for example, as illustrated in FIG. 17, the current source transistor NECK_L may be omitted in the low-side power source path CS_L of the two power source paths CS_H and CS_L, and the back gate may be coupled to an internal node (source or drain) in the power gate transistor PG_L. Also in such a case, it is possible to suppress occurrence of the Well-Forward in the power gate transistor PG_L provided in the low-side power source path CS_L when the high-side power source path CS_H of the two power source paths CS_H and CS_L starts supplying a current. As a result, it is possible to suppress power loss. Accordingly, it is possible to provide the memory cell array unit 400 in which power loss is less likely to occur.

It is to be noted that, in the present modification example, as described in the foregoing Modification Example D, the back gate may be coupled to an internal node (source or drain) in the current source transistor NECK_H provided in the high-side power source path CS_H of the two power source paths CS_H and CS_L. In such a case, the driving capacity of the current source transistor NECK_H is improved, which leads to obtainment of the same driving capacity with a smaller area, thus making it possible to improve an area efficiency.

Modification Example F

In the foregoing embodiment and modification examples thereof, the write driver 23a may include, for example, a replica circuit 24 as illustrated in FIG. 18. When selecting the low-side power source path CS_L from among the two power source paths CS_H and CS_L to perform writing into the magnetoresistance change element MTJ, the replica circuit 24 performs a feedback control on a gate voltage VNK to allow the gate voltage VNK of the current source transistor NECK_L provided in the low-side power source path CS_L to be a predetermined voltage. Here, the "predetermined voltage" refers to a voltage Vmtj which is lower than a voltage (a breakdown voltage Vbd) to be applied to the magnetoresistance change element MTJ when the magnetoresistance change element MTJ is broken by an overcurrent.

The replica circuit 24 includes, for example, an operation amplifier 24A of which an output terminal is coupled to the gate of the current source transistor NECK_L provided in each power source path CS_L inside the write driver 23a. The replica circuit 24 further includes, for example, a current source transistor Tr1 having the same configuration as that of the current source transistor NECK_L, a switch SW1 having the same configuration as those of the column switch elements SWb and SWs, and a memory cell MC1 having the same configuration as that of the memory cell MC. The current source transistor Tr1, the switch SW1, and the memory cell MC1 are coupled together in a mode similar to the mode in which the current source transistor NECK_L, the column switch elements SWb and SWs, and the memory cell MC are coupled together.

An externally applied voltage VNKREF supplied from the power source circuit 500 and a voltage VFB to be applied to the memory cell MC1 are inputted to two input terminals of the operation amplifier 24A. The operation amplifier 24A increases the output voltage VNK within a range of 0 V to 1.0 V, for example, to allow VFB=VNKREF to hold when VFB>VNKREF holds. At this time, a current flowing to the memory cells MC and MC1 is decreased. Meanwhile, the operation amplifier 24A decreases the output voltage VNK within a range of 0 V to 1.0 V, for example, to allow VFB=VNKREF to hold when VFB<VNKREF holds. At this time, a current flowing to the memory cells MC and MC1 is increased.

In the present modification example, the replica circuit 24 that controls the gate voltage of the current source transistor NECK_L is provided. This makes it possible to prevent the magnetoresistance change element MTJ from being broken by an overcurrent.

Although the description has been given hereinabove of the present disclosure with reference to the embodiment and modification examples thereof, the present disclosure is not limited to the foregoing embodiments, etc., and may be modified in a wide variety of ways. In the foregoing embodiment, the memory cell array 30 is the STT-MRAM. However, in the foregoing embodiment, the memory cell array 30 may be an MRAM different from the STT-MRAM, or may be a non-volatile memory different from the MRAM.

It is to be noted that the effects described herein are merely illustrative. The effects of the present disclosure are not limited to those described herein. The present disclosure may have other effects than those described herein.

In addition, for example, the present disclosure may have the following configurations.

(1)
A semiconductor storage including:
two power source paths each including a power gate transistor and a current source transistor which are coupled in series;
a connection path that connects ends of the respective power source paths on a side of the current source transistor;
a storage element; and
a switch element inserted between the connection path and the storage element, in which
a back gate is coupled to an internal node in the current source transistor provided in a low-side path of the two power source paths.

(2)
The semiconductor storage according to (1), further including a control circuit that selects one of the two power source paths by controlling the power gate transistor, the current source transistor, and the switch element, and performs writing into the storage element by flowing a current supplied from the selected power source path to the storage element via the switch element.

(3)
The semiconductor storage according to (1) or (2), in which
the internal node is configured by a p-type semiconductor, and
the back gate is coupled to a drain in the current source transistor provided in the low-side path of the two power source paths.

(4)
The semiconductor storage according to (1) or (2), in which
the internal node is configured by a p-type semiconductor, and
the back gate is coupled to a source in the current source transistor provided in the low-side path of the two power source paths.

(5)
The semiconductor storage according to (2), in which
the internal node is configured by an n-type semiconductor,
the back gate is coupled to a drain in the current source transistor provided in the low-side path of the two power source paths, and
the control circuit turns on the power gate transistor provided in the low-side path when the switch element is turned off.

(6)
The semiconductor storage according to (2), in which the power gate transistor provided in the low-side path of the two power source paths includes a back gate switch element that selectively supplies the back gate with a voltage supplied to ends of the two power source paths on a side of the power gate transistor.

(7)
The semiconductor storage according to (6), in which, when a high-side path is selected from among the two power source paths, the control circuit controls the back gate switch element to supply the voltage supplied to the end of the high-side path, of the two power source paths, on the side of the power gate transistor, to the back gate of the power gate transistor provided in the low-side path of the two power source paths.

(8)
The semiconductor storage according to any one of (1) to (7), in which the back gate is coupled to the internal node in the current source transistor provided in the high-side path of the two power source paths.

(9)
The semiconductor storage according to any one of (1) to (8), in which the current source transistor provided in the low-side path of the two power source paths includes a thin-film transistor.

(10)
The semiconductor storage according to any one of (1) to (9), in which the storage element includes a magnetoresistance change element.

(11)

The semiconductor storage according to (2), in which the control circuit includes a circuit that performs a feedback control to allow a gate voltage of the current source transistor provided in the low-side path to be a predetermined voltage when the low-side path is selected from among the two power source paths to perform the writing into the storage element.

(12)

A semiconductor storage including:
a first power source path including a first power gate transistor and a first current source transistor which are coupled in series;
a second power source path including a second power gate transistor;
a connection path that connects ends of the respective power source paths;
a storage element; and
a switch element inserted between the connection path and the storage element, in which
a back gate is coupled to an internal node in the second power gate transistor.

(13)

The semiconductor storage according to (12), further including a control circuit that selects one of the two power source paths by controlling the first power gate transistor, the second current source transistor, the second power gate transistor, and the switch element, and performs writing into the storage element by flowing a current supplied from the selected power source path to the storage element via the switch element.

(14)

The semiconductor storage according to (12) or (13), in which
the internal node is configured by a p-type semiconductor, and
the back gate is coupled to a drain in the second power gate transistor.

(15)

The semiconductor storage according to any one of (12) to (14), in which the storage element includes a magnetoresistance change element.

(16)

The semiconductor storage according to any one of (12) to (15), in which the back gate is coupled to the internal node in the current source transistor provided in the first power source path.

According to the semiconductor storage of an embodiment of the present disclosure, the back gate is coupled to the internal node in the low-side current source transistor provided in the low-side power source path. This makes it possible to suppress the phenomenon (Well-Forward) in which an unintentional current flows to the low-side current source transistor as a result of occurrence of a forward bias at the back gate of the low-side current source transistor when the high-side power source path starts supplying a current. As a result, it is possible to suppress power loss. Accordingly, it is possible to provide a semiconductor storage in which power loss is less likely to occur. It is to be noted that the effects of the present technology are not necessarily limited to the effects described herein, and may be any of the effects described herein.

This application claims the benefit of Japanese Priority Patent Application JP2020-094988 filed with the Japan Patent Office on May 29, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor storage, comprising:
two power source paths that include a low-side path and a high-side path, wherein
each of the two power source paths includes a power gate transistor and a current source transistor, and
the power gate transistor and the current source transistor are coupled in series;
a connection path that connects an end of each of the two power source paths on a side of a respective current source transistor of each of the two power source paths;
a storage element;
a switch element between the connection path and the storage element, wherein a first back gate is coupled to a first internal node in the respective current source transistor of the low-side path of the two power source paths; and
a control circuit configured to:
control each of the power gate transistor, the current source transistor and the switch element;
select one of the low-side path or the high-side path based on the control of each of the power gate transistor, the current source transistor, and the switch element;
supply, via the switch element, current from the selected one of the low-side path or the high-side path to the storage element; and
write on the storage element based on the supplied current.

2. The semiconductor storage according to claim 1, wherein
the first internal node includes a p-type semiconductor, and
the first back gate is coupled to a first drain in the respective current source transistor in the low-side path.

3. The semiconductor storage according to claim 1, wherein
the first internal node includes a p-type semiconductor, and
the first back gate is coupled to a first source in the respective current source transistor in the low-side path.

4. The semiconductor storage according to claim 1, wherein
the first internal node includes an n-type semiconductor,
the first back gate is coupled to a first drain in the respective current source transistor in the low-side path, and
the control circuit is further configured to:
turn off the switch element; and
turn on the power gate transistor in the low-side path.

5. The semiconductor storage according to claim 1, wherein the power gate transistor in the low-side path includes a back gate switch element configured to selectively supply a second back gate of the power gate transistor with a voltage supplied to the end of each of the two power source paths on a side of the power gate transistor of each of the two power source paths.

6. The semiconductor storage according to claim 5, wherein the control circuit is further configured to:
select the high-side path from the two power source paths, control the back gate switch element to supply the voltage, supplied to the end of the high-side path, to the second back gate of the power gate transistor in the low-side path.

7. The semiconductor storage according to claim 1, wherein a third back gate is coupled to a third internal node in the respective current source transistor in the high-side path of the two power source paths.

8. The semiconductor storage according to claim 1, wherein the respective current source transistor in the low-side path of the two power source paths comprises a thin-film transistor.

9. The semiconductor storage according to claim 1, wherein the storage element comprises a magnetoresistance change element.

10. The semiconductor storage according to claim 1, wherein the control circuit is further configured to:
    select the low-side path from the two power source paths;
    perform a feedback control to set a gate voltage of the respective current source transistor in the low-side path to a specific voltage; and
    write on the storage element based on the feedback control.

11. A semiconductor storage, comprising:
    two power source paths that include:
        a first power source path that includes a first power gate transistor and a first current source transistor, wherein the first power gate transistor and the first current source transistor are coupled in series;
        a second power source path that includes a second power gate transistor;
    a connection path that connects an end of each of the two power source paths;
    a storage element;
    a switch element between the connection path and the storage element, wherein a back gate is coupled to an internal node in the second power gate transistor; and
    a control circuit configured to:
        control each of the first power gate transistor, the first current source transistor, the second power gate transistor, and the switch element;
        select one of the first power source path or the second power source path based on the control of each of the first power gate transistor, the first current source transistor, the second power gate transistor, and the switch element;
        supply, via the switch element, current from the selected one of the first power source path or the second power source path to the storage element; and
        write on the storage element based on the supplied current.

12. The semiconductor storage according to claim 11, wherein
    the internal node includes a p-type semiconductor, and
    the back gate is coupled to a drain in the second power gate transistor.

13. The semiconductor storage according to claim 11, wherein the storage element comprises a magnetoresistance change element.

14. The semiconductor storage according to claim 11, wherein the back gate is coupled to the internal node in the first current source transistor in the first power source path.

* * * * *